United States Patent [19]
Prioste et al.

[11] Patent Number: 5,006,820
[45] Date of Patent: Apr. 9, 1991

[54] LOW REFLECTION INPUT CONFIGURATION FOR INTEGRATED CIRCUIT PACKAGES

[75] Inventors: Jerry E. Prioste, Scottsdale; Keith Nelson, Tempe, both of Ariz.

[73] Assignee: Motorola, Inc., Schaumburg, Ill.

[21] Appl. No.: 374,791

[22] Filed: Jul. 3, 1989

[51] Int. Cl.$^5$ .............................................. H03H 7/38
[52] U.S. Cl. ..................................... 333/33; 333/246; 333/247
[58] Field of Search .................. 333/33, 246, 247, 32, 333/22 R

[56] References Cited

U.S. PATENT DOCUMENTS

| | | | |
|---|---|---|---|
| 3,585,455 | 6/1971 | Naylor | 333/238 X |
| 3,886,505 | 5/1975 | Jacobson | 333/247 |
| 3,990,024 | 11/1976 | Hou | 333/33 |
| 4,228,369 | 10/1980 | Anantha et al. | 333/22 R X |
| 4,276,558 | 6/1981 | Ho et al. | 333/247 X |
| 4,414,480 | 11/1983 | Zasio | 333/32 X |
| 4,513,355 | 4/1985 | Schroeder et al. | 361/403 |
| 4,751,482 | 6/1988 | Fukuta et al. | 333/247 |
| 4,768,004 | 8/1988 | Wilson | 333/246 |

OTHER PUBLICATIONS

Product Datasheet, TriQuint Products; PK-MLC1-32E/PK-MLC132S; Apr. 21, 1988.

*Primary Examiner*—Eugene R. LaRoche
*Assistant Examiner*—Benny Lee
*Attorney, Agent, or Firm*—Joe E. Barbee; Stuart T. Langley

[57] ABSTRACT

An integrated circuit package having a low reflection input pin comprising a high frequency signal conductor internal to the semiconductor package is provided by coupling a first input pin to a second input pin with a conductive path, the conductive path having a constant characteristic impedance which matches the characteristic impedance of an external signal line which is coupled to the first input pin. A portion of the conductive path forms a bonding pad using for wire bonding, or other bonding technique, between the conductive path and a bonding pad of the integrated circuit. In this manner the impedance mismatch between an external signal conductor and the integrated circuit bonding pad is eliminated, and the total impedance mismatch between the semiconductor package and the external signal line is greatly reduced, resulting in higher frequency operation of the integrated circuit.

16 Claims, 3 Drawing Sheets

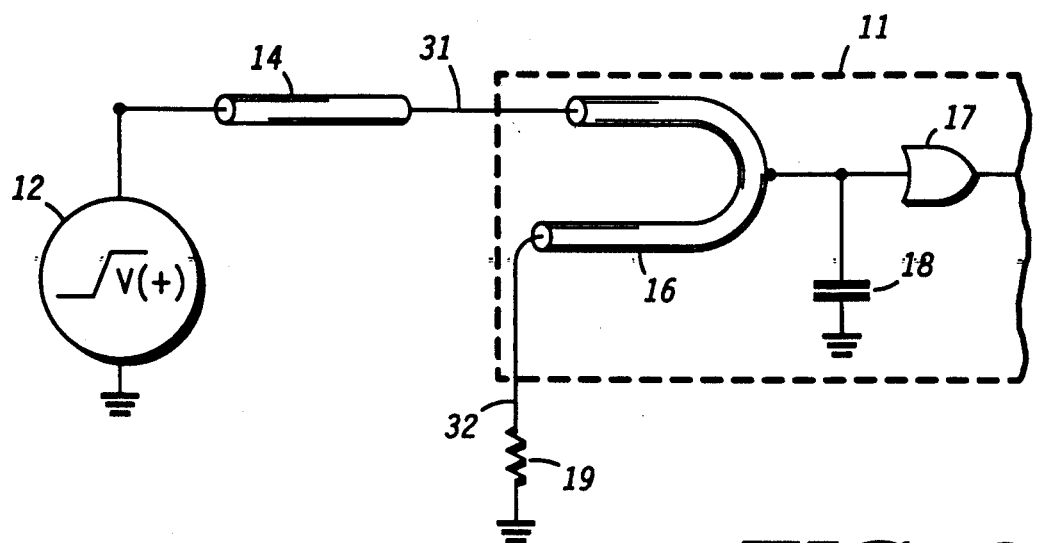
FIG. 2
FIG. 3
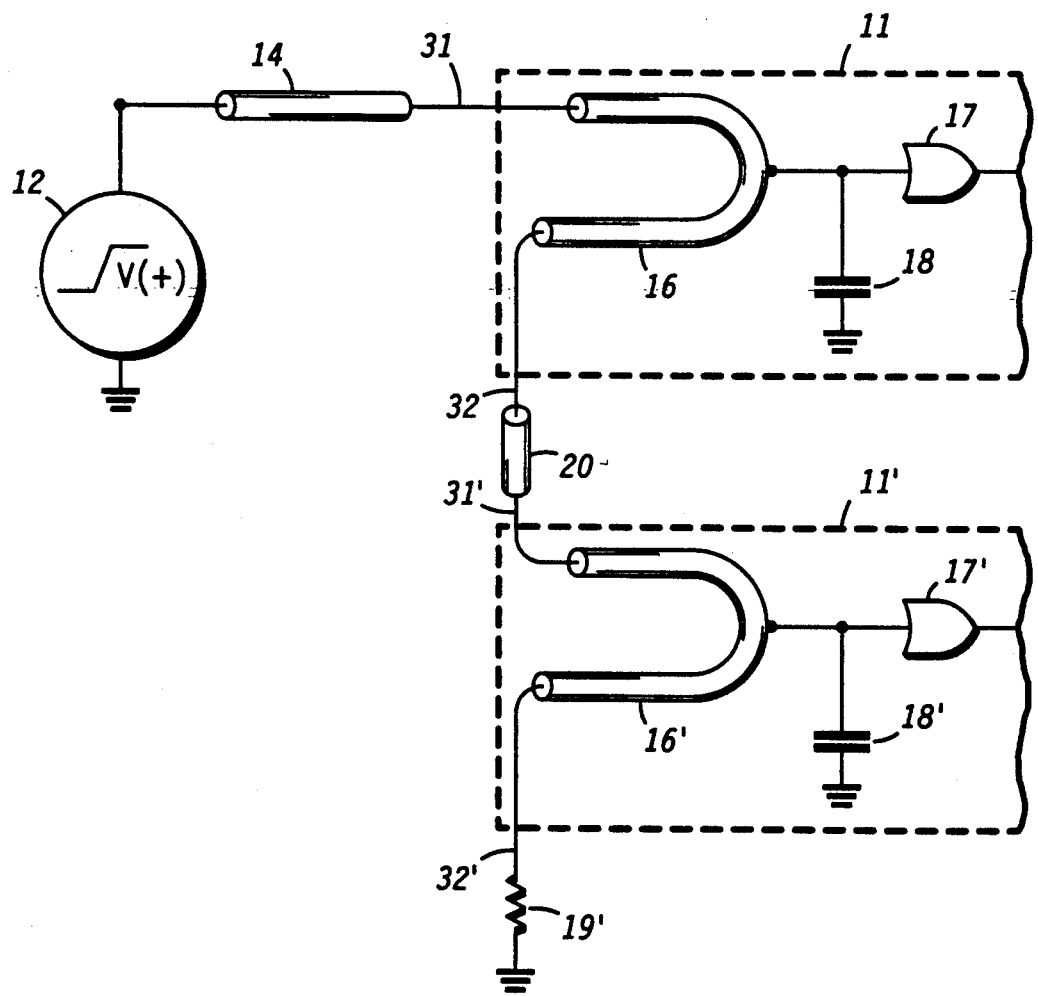

LOW REFLECTION INPUT CONFIGURATION FOR INTEGRATED CIRCUIT PACKAGES

BACKGROUND OF THE INVENTION

The present invention relates, in general, to integrated circuit packages. More particularly, the invention relates to a pin grid array (PGA) integrated circuit package having an internal transmission line.

A crucial step in manufacturing integrated circuits is packaging those circuits so that the package itself does not degrade or limit the electrical performance of the integrated circuit. A package provides electrical coupling between a pin, which extends outside of the package, and a bonding pad of the integrated circuit. Operating speeds of integrated circuits have increased dramatically, particularly in communication applications where operating speeds may be 1 GHz or more. At the same time, circuits have become more complex, requiring more package pins to conduct signals to and from the integrated circuit. Increasing numbers of package pins result in larger packages, and pins which are farther away from the integrated circuit. Conductive lines are formed inside the semiconductor package to couple the pins to the integrated circuit, and larger packages result in correspondingly longer conductive lines. Longer conductive lines, for reasons described hereinafter, reduce the operating speed of the package, and thus limit the operating speed of the integrated circuit inside the package.

A common integrated circuit package type is a pin-grid-array (PGA) so called because it comprises a plurality of terminals, or pins, which are arranged in a grid on a substrate. Usually the substrate is a multi-layer sandwich of dielectric material and patterned metal layers. The substrate usually has a hole in the center in which an integrated circuit is mounted. The conductive lines which couple the package pins with the integrated circuit are formed by the patterned metal layers. In the past, a single conductive line coupled each pin with a package bond pad formed at an inner edge of the substrate, and a wire bond coupled the package bond pad with a bond pad on the integrated circuit. An external signal enters the package via the pin and is transferred to the integrated circuit via the signal line and wire bond. Because multiple layers of metal are used in the PGA package, the conductive line formed a stripline conductor, wherein the conductive line was sandwiched between two ground planes and isolated from the ground planes by a layer of dielectric material. These stripline conductors are also called signal lines, or transmission lines. The stripline conductor design reduced signal distortion as the signal traveled from the package pin to the integrated circuit, but due to the difficulties in adding terminating resistors the stripline conductors were not terminated, which resulted in large reflection voltages when signals had fast edge rates.

To achieve higher operating frequencies, clock signals and data signals must have faster edge rates. To minimize distortion, signals having fast edge rates are conducted external to the semiconductor package on signal lines having a constant characteristic impedance $Z_0$, which is usually 50 ohms, and the signal lines are terminated with an impedance which matches the signal line. This is because when a signal having a fast edge rate is transmitted on a signal line with variable impedance, or which is not terminated with a matching impedance, at each impedance mismatch a portion of the signal is reflected back towards the signal source, and a portion is transmitted forward on the signal line. The magnitude of the reflected voltage is a function of the edge rate of the signal and the capacitance of the transmission line termination. The terminating resistance is coupled between the signal line and ground reference or a negative or positive power supply. The signal is coupled to a receiving gate, also called a receiving line, of an integrated circuit by a branch signal line coupled to the terminated transmission line. Unterminated signal lines which branch from a terminated transmission line will also cause reflected voltages, the magnitude of which is a function of signal edge rate and capacitance of the unterminated branch. Unterminated branches are also called "stubs" or "open lines". A terminated, impedance matched signal line will not add to the capacitance of a stub whereas an unterminated signal line will.

Three basic types of signal lines are commonly used: constant characteristic impedance lines which are terminated, constant impedance lines which are unterminated, and variable impedance lines which are unterminated. While a terminated variable impedance line is possible, it is usually not worth the added expense to terminate a signal line which has a variable impedance. External signal lines, which couple semiconductor packages with external circuitry, are usually the terminated, constant impedance type. Until now, internal signal lines, which couple the external signal line to the integrated circuit, have been of the other two types. Because of this, until now, semiconductor packages have been coupled to terminated external signal lines so that the package appeared as a stub on the external signal line. When edge rates were relatively slow, and the capacitance of this unterminated branch was relatively small, the reflected voltage caused by this stub was insignificant. More recently, however, the reflected voltage caused by the package has become a limiting factor in both edge rate speed and package size.

The capacitance of the package signal line is a sum of both the package capacitance and the capacitance of the receiving gate of an integrated circuit. The receiving gate of an integrated circuit will not be impedance matched to the external signal line, and so will necessarily be a capacitance stub. A typical package signal line had a capacitance of 4-10 pF, of which only 1-2 pF was caused by the receiving gate. Thus, the package itself added a majority of the capacitance to the package signal line.

Reflected signals from the package signal line caused several problems. First, the wave shape of the signal that reached the receiving gate was distorted because part of the signal had been reflected, resulting in slower rise times and lower operating frequency. Second, the reflected portion of the signal appeared as noise on the external signal line, reducing the noise margin of data on that line. Third, the reflected wave caused standing waves in the signal line, which caused the signal amplitude to increase and decrease depending on capacitance of the package and signal frequency, further reducing the noise margin. All of these problems were aggravated when signal edge rates increased. Eventually the receiving gate did not operate reliably because of the reduced noise margin.

It is often desirable to use a single external signal line to provide a signal, such as a clock signal, to several semiconductor packages. In the past, each package that was coupled to the signal line created reflected noise on the signal line. Since noise from each package accumulated on the signal line, the noise margin was reduced dramatically for each package added to the external signal line. Thus, when two or more packages were coupled in this fashion, operating frequency was greatly reduced to compensate for the reduced noise margin.

The primary cause of these problems is the capacitance of the unterminated transmission line formed by the conductive lines in the semiconductor package. In the past, the most straight forward solution was to design the integrated circuit so that it required fewer pins. Although this allowed the pins to be located closer to the integrated circuit, it posed obvious limitations on the circuit design. Another solution was to reduce the dimensions of the package pins and the conductor lines between the pins and the integrated circuit so that more pins can be placed in a smaller space. This also resulted in shorter conductive lines between pins and the integrated circuit, but increased difficulty of manufacturing a package and expense to the manufacturer. Until now, those types of solutions to the impedance mismatch problem have at best been able to reduce the effects of the capacitance of the connection between the package pin and the integrated circuit, but have been unable to eliminate them.

Accordingly, it is an object of the present invention to provide an integrated circuit package with a low reflection input configuration.

It is a further object of the present invention to provide an integrated circuit package with reduced impedance mismatch between the package and high frequency signal lines which are coupled to the package.

It is an additional object of the present invention to provide an integrated circuit package having an internal transmission line with a constant characteristic impedance which can be terminated.

It is a further object of the present invention to provide an integrated circuit package which eliminates the effects of capacitance due to a conductor between the package pin and the integrated circuit.

It is a still further object of the present invention to provide an integrated circuit package which is compatible with conventional pin-grid-array manufacturing techniques.

It is a further object of the present invention to provide an integrated circuit package having an input pin which can be coupled in series with other integrated circuit packages to a single external signal line.

SUMMARY OF THE INVENTION

These and other objects and advantages of the present invention are achieved by providing an integrated circuit package having a low reflection input pin comprising a transmission line inside the integrated circuit package which can be terminated. The low reflection input pin is provided by internally coupling a first input pin to a second input pin with a conductive path, the conductive path having a constant characteristic impedance which matches the characteristic impedance of an external signal line which is coupled to the first input pin. A portion of the conductive path forms a bonding pad used for wire bonding, or other bonding technique, between the conductive path and a bonding pad of the integrated circuit. A terminating impedance which matches the characteristic impedance of the conductive path is intended to be coupled between the second input pin and ground. In this manner the impedance mismatch due to the integrated circuit package is eliminated, and the total impedance mismatch between the semiconductor package and the external signal line is greatly reduced, resulting in higher frequency operation of the integrated circuit.

BRIEF DESCRIPTION OF THE DRAWINGS

FIG. 2 is a schematic diagram of a first embodiment of the present invention;

FIG. 3 is a schematic diagram of a second embodiment of the present invention.

DETAILED DESCRIPTION OF THE DRAWINGS

Figure 1:
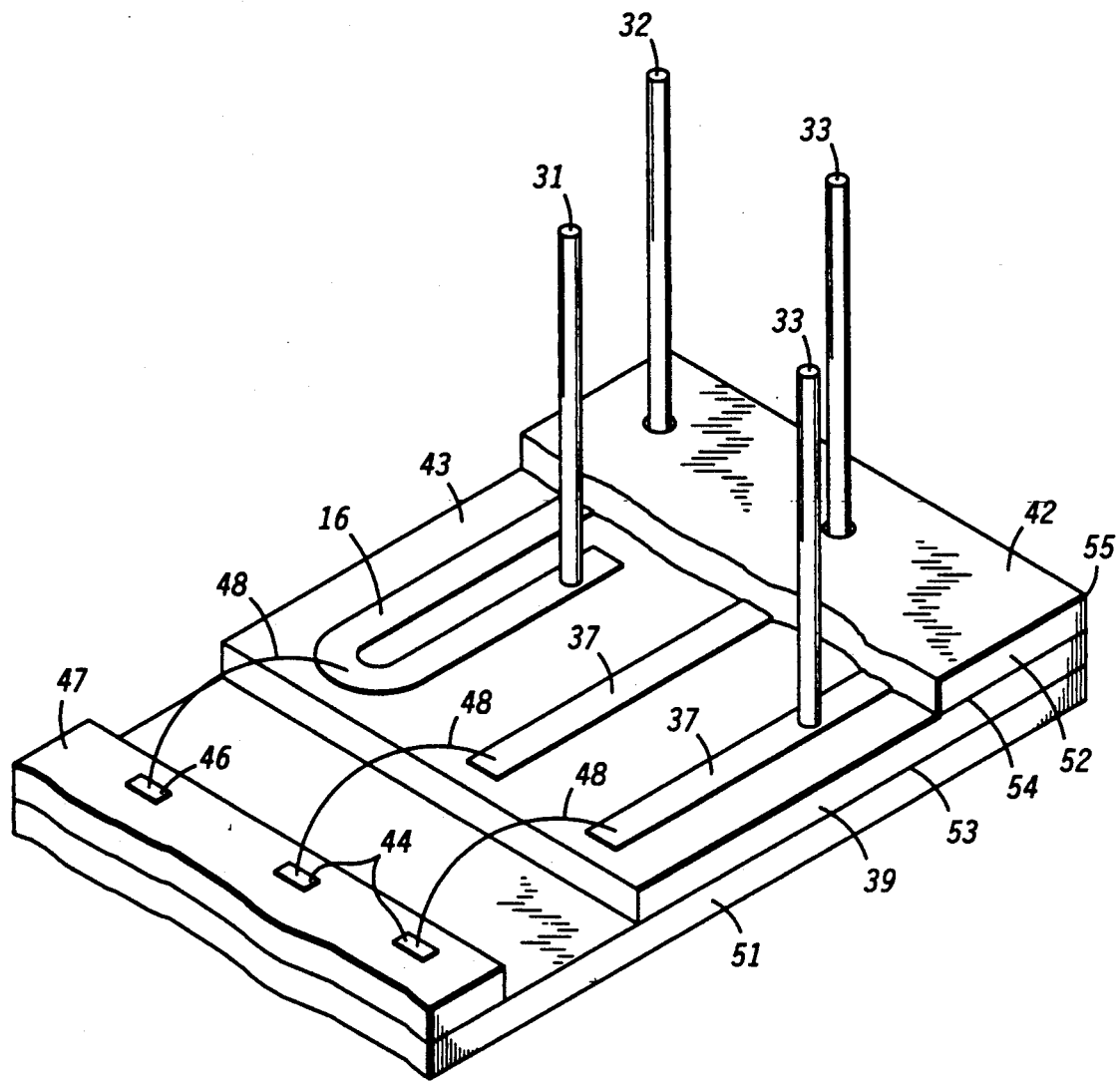
FIG. 1 is an enlarged cut-away perspective view of a portion of a semiconductor package embodying the present invention.

FIG. 1 illustrates a highly simplified cut-away perspective view of a portion of a pin-grid-array semiconductor package. Pins 31, 32, and 33 extend from the package and are designed to be coupled to external signal lines or external power supplies. Pins 31-33 are mounted on a multilayer substrate comprising dielectric layers 51, 39, and 52, and conductive layers 53, 54, and 55, which are formed between the dielectric layers. Conductive layer 54 is patterned to form conductive lines 16 and 37, whose shape and function will be described in greater detail hereinafter. Patterned layer 54 is called the signal layer because patterned conductors 16 and 37 are used to conduct data signals into and out of the package. Conductive layers 53 and 55 are thus provided above and below conductive lines 16 and 37 so that if conductive layers 55 and 53 are coupled to a DC power supply or ground, conductive lines 16 and 37 form stripline conductors. Conductive layers 53 and 55 may be patterned or continuous as long as they are coupled so as to make conductive line 16 a stripline conductor. Although it is preferable to provide ground planes above and below patterned conductive lines 16 and 37, either layer 53 or 55 may be omitted, resulting in a conductive line 16, 37 with a single ground plane above or below it, in which case the signal lines 16 and 37 are modified microstrip line conductors.

Although FIG. 1 illustrates only three conductive layers 53, 54, and 55, practical packages may include nine or more conductive layers which are similar to those shown in FIG. 1. These additional layers are formed above and below signal layer 54 in a sandwich fashion, and usually are coupled to external power supplies. Pins 31 and 32 couple to conductive line 16, and form a low reflection input to the semiconductor package. Pins 33 are coupled to conventional conductive lines 37. Portions of signal lines 16 and 37 near inner edge 43 of substrate layer 54, provide package bonding pads for wirebonds 48. Conductive lines 16 and 37 are coupled to bond pads 46 and 44 respectively of integrated circuit 47 by wire bonds 48.

Conductive line 16 is also called a high frequency signal conductor (HFSC), and has a substantially constant characteristic impedance, typically 50 ohms. The characteristic impedance $Z_0$ at any point along signal line 16 is calculated by the formula:

$$Z_0 = \frac{60}{e_r^{0.5}} \ln\left[\frac{4B}{0.67\pi W(0.8 + T/W)}\right]$$

where:

$Z_0$ = Characteristic impedance
$e_r$ = dielectric constant for ceramic packages
B = dielectric separation between the two ground planes
W = signal line width
T = signal line thickness Pin 32 couples to HFSC 16 near outer edge 42, so that the distance between HFSC 16 and outer edge 42 is minimal. The location of pin 31 and the shape of HFSC 16 are not critical, although a portion of HFSC 16 should extend near inner edge 43 so that wire bond 48 is as short a possible. Bond pad 46 is coupled to a receiving gate, such as a clock input or high speed data input of integrated circuit 47. Bond pads 44 are conventional low speed data inputs or outputs to integrated circuit 47.

FIG. 2 illustrates a schematic diagram of a circuit utilizing semiconductor package 11 which embodies the present invention. FIG. 2 illustrates only one receiving gate 17 of an integrated circuit which has a plurality of gates (not shown). The present invention is typically used only on high speed input lines such as those used for clock signals or high speed data. A typical package may have several hundred input gates of which only one or two are required to operate at high speed. The circuit shown in FIG. 2 and described hereinafter is used on each input that requires high speed operation and thus may be replicated any number of times required by the integrated circuit and application. High speed voltage signal 12 is generated external to the package by discrete components, integrated circuits, external circuitry, or the like. Voltage signal 12 is coupled to package 11 by external signal line 14 which has a characteristic impedance $Z_0$. Typically, the characteristic impedance for signal line 14 is 50 ohms. Signal line 14 is coupled to input pin, or terminal, 31 of package 11. Input pin 31 is coupled to internal signal line 16 which also has a constant characteristic impedance $Z_0$. HFSC 16 is coupled at one end to first input pin 31 and at the other end to second input terminal 32. In a first embodiment, illustrated in FIG. 2, second input terminal 32 is terminated by resistor 19, which has the same value as the characteristic impedance, $Z_0$, of signal lines 16 and 14. Termination resistor 19 is coupled between the second input terminal 32 and ground. In certain applications, termination resistor 19 may also be coupled to a negative power supply voltage. Internal high speed conductor 16 is coupled to receiving gate 17 of the integrated circuit by wire bond or tape automated bonding techniques. Capacitor 18 represents the internal capacitance of receiving gate 17. Because HFSC 16 is impedance matched to external signal line 14, voltage signal 12 is transferred from external signal line 14 to internal signal line 16 without a reflection generated at the interface and the capacitance associated with internal signal line 16 is effectively eliminated with respect to high speed signal 12. The total package impedance which effects high speed signal 12 is a sum of the capacitance associated with signal line 16 and the capacitance 18 associated with receiving gate 17. By matching the impedance of HFSC 16 to signal line 14 the package impedance which affects the high speed signal 12 is effectively reduced to 1 pF regardless of the physical separation of input pin 31 from receiving gate 17.

FIG. 3 illustrates a schematic diagram of a second embodiment of the present invention. The second embodiment further includes second package 11', which is similar to first package 11. High speed signal 12 is coupled to both packages 11 and 11' using the internal high speed signal conductor 16 and 16' of the present invention. Signal 12 is transferred to receiving gate 17 of package 11 as described hereinbefore. Second input terminal 32 of semiconductor package 11 is coupled to signal line 20 which has constant characteristic impedance $Z_0$, which is the same characteristic impedance as signal lines 16 and 14. The other end of signal line 20 is coupled to first input pin 31' of package 11'. First input pin 31' is coupled to internal high speed signal conductor 16'. The elements of semiconductor package 11' bearing the prime designation and terminating resistor 19" are coupled and function in a similar manner to those elements without a prime designation described in reference to FIG. 2. Thus, high speed signal 12 is coupled to input pin 31' of package 11' through first and second input pins 31 and 32 respectively of package 11. Since all of the signal lines 14, 16, 20, and 16' have the same characteristic impedance $Z_0$, no reflection results as the signal is transferred from one signal line to the next. The only reflections caused by impedance mismatch are generated by the capacitance stubs resulting from the input capacitance of logic gates 17, 17', and represented by capacitors 18 and 18', which are minimal as described hereinbefore. Several packages can be coupled in this manner, but for best high frequency performance only two or three packages should be coupled to a single signal line. The series of packages must always be terminated by coupling a second input pin 32" of package 11' to resistor 19' to eliminate reflected voltages generated by an impedance mismatch at the end of the final high frequency signal conductor.

Figure 4:
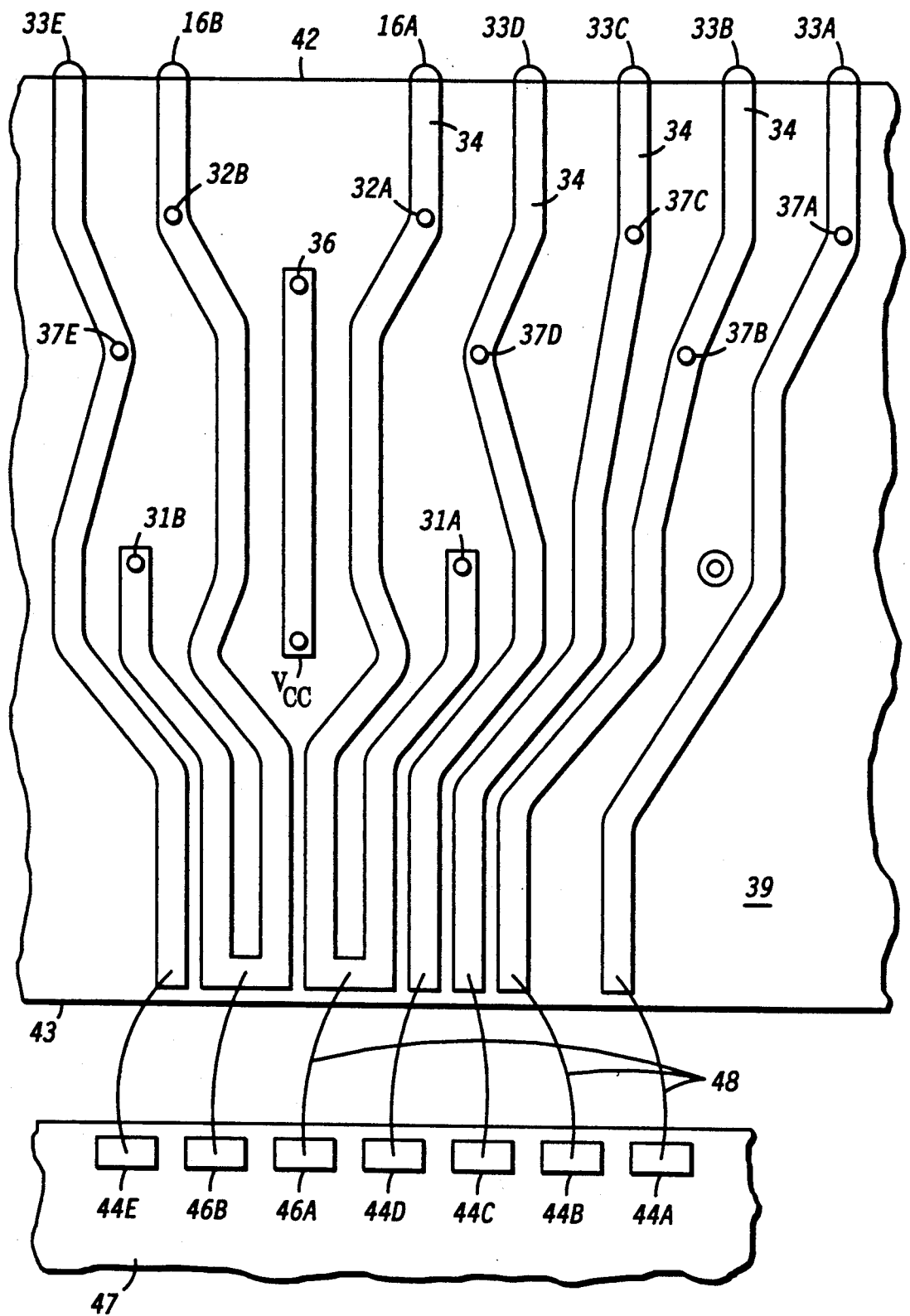
FIG. 4 illustrates a plan view of a portion of a semiconductor package embodying the present invention.

FIG. 4 illustrates a plan view of a portion of a semiconductor package embodying the low reflection input configuration of the present invention. Pins 37A-37E, 31A-31B and 32A-32B are laid out on dielectric substrate 39 in a grid. The package configuration, of which a small portion is illustrated in FIG. 4, is a pin-grid array, but it should be understood that the invention may be embodied in other semiconductor package types such as dual in-line packages or the like. Pins 37A-37E are low speed signal and data lines, which account for the majority of the package pins, and are used for low speed data signals, DC power supply voltages, or ground reference. Pins 37A-37E, 31A-31B and 32A-32B extend outside the package so that external circuitry may be coupled to them. An outside edge of dielectric substrate 39 is illustrated by line 42. Signal conductors 33A-33E are formed on the surface of dielectric substrate 39 so as to couple to corresponding pins 37A-37E. Usually conductor lines 33A-33E are formed by plating conductive materials, such as gold, nickel, and tungsten on to a surface of dielectric substrate 39. In order to plate conductors 33A-33E each conductor must extend to edge 42 so that electrical contact can be made to the conductor during plating. Plating connectors 34, which extend from a pin 37A-37E to edge 42, serve no function after plating is complete, and if another method was used to form conductors 33A-33E, such as evaporation or sputtering, plating connectors 34 would not be present.

The semiconductor package comprises dielectric substrate 39 having inside edge 43 and outside edge 42, and integrated circuit 47. Dielectric substrate 39 usually surrounds integrated circuit 47 so that several hundred connections similar to those shown in FIG. 4 can be made to integrated circuit 47. A prior art pin-grid-array package similar to that shown in FIG. 4 is shown in U.S. Pat. No. 4,513,355 issued to Schroeder et al., and incorporated herein by reference. Signal conductors 33A-33E extend from pins 37A-37E to the inside edge 43 of dielectric substrate 39. The portion of signal conductors 33A-33E which lies near edge 43 serves as a bonding pad for wire bonds 48. Wire bonds 48 couple each signal conductor to an input bond pad 44A-44E of integrated circuit 47. Conductive interconnections (not shown) are formed on the surface of integrated circuit 47 which couple active devices in integrated circuit 47 to bond pads 44A-44E.

Pin 31A is the first input pin of internal HFSC 16 shown in FIG. 1. Pin 32A is the second input pin coupled to internal HFSC 16 shown in FIG. 1. Pins 31A and 32A are connected to each other at inside edge 43 by high frequency signal conductor 16A which is formed of the same materials and in the same manner as signal conductors 33A-33E. High frequency signal conductor 16A is formed so as to have a substantially constant characteristic impedance, typically 50 ohms, as described in reference FIG. 1. A portion of high speed signal conductor 16A extends to inside edge 43 of dielectric substrate 39 and serves as a bonding pad for a wire bond 48. Wire bond 48 couples high speed signal conductor 16A to integrated circuit bond pad 46A, which is a clock input, or other high speed signal input, of integrated circuit 47. Bond pad 46A is coupled by a metal interconnection (not shown) to receiving gate 17 shown in FIG. 1. When pins 31A and 32A are coupled to external high speed signal lines as shown in FIG. 1, a signal traveling into package 11 via first input pin 31A will see no impedance mismatches as it enters the package. The capacitance due to wire bond 48 and bonding pad 46A, which is the stub capacitance 18 shown in FIG. 2, does present an impedance mismatch, and will cause a reflected signal on high speed signal conductor 16A. As set out above, the stub capacitance of wire bond pad 46A is minimal compared to the stub capacitance associated with a conventional signal conductor line such as 33A-33E.

Pins 31B and 32B, as well as HFSC 16B are simply duplicates of pins 31A, 32A, and signal conductor 16A, and provide a second high speed signal path from outside the package to integrated circuit 47. FIG. 4 illustrates the two HFSC's 16A, 16B mirrored thus forming a differential clock input. When HFSCs 16A, 16B are coupled in this manner, the package is capable of clock frequencies which are double that of frequencies used when a single HFSC is used.

It may be desirable to increase the characteristic impedance of the portion of HFSCs 16A-16B which serves as a wire bond pad to compensate for the low impedance of the stub capacitance 18 which is coupled to HFSCs 16A-16B at that point. For example, at 1 GHz a stub capacitance of 0.8 pF represents an impedance of 200 ohms, which is coupled in parallel to bonding pad portion of HFSCs 16A-16B. By increasing the characteristic impedance of this portion of HFSCs 16A-16B by a factor of approximately 20%, the effects of stub impedance at high frequency are limited. This can be accomplished by making HFSCs 16A-16B narrower in the region which serves as a bond pad.

Plating connectors 34 which are coupled to HFSCs 16A-16B act as a capacitance stub, and also generate a reflection on the signal lines. Because of plating connectors 34, every conventional conductor 33A-33E must extend from inside edge 43 to outside edge 42, regardless of the location of pins 37A-37E. Thus, when a large package is required, even the pins nearest inside edge 43 have a long plating connector 34, and thus a large stub capacitance. Therefore, with conventional signal lines 33A-33E, even the pins nearest inside edge 43 have a reduced ability to conduct high frequency signals. The impedance mismatch caused by plating connector 34 is minimized in HFSCs 16A-16B by placing pins 32A-32B as close as possible to edge 42, so that the length and capacitance of plating connectors 34 is minimized. When this is done, the capacitance of plating connector 34 is minimized, while at the same time the capacitance of HFSCs 16A-16B is less than even the pin 37 which is nearest to inside edge 43.

In order to reduce cross talk between high frequency signal conductors 16A-16B and low speed signal conductor lines 33A-33E it is preferable to provide a DC voltage or a ground reference on signal conductor lines 33D and 33E which are adjacent to high speed signal conductor lines 16A-16B. Thus pins 37D and 37E are usually coupled to ground reference or a supply voltage. To reduce cross talk between HFSCs 16A-16B, power supply line 36, which is coupled to DC power supply $V_{cc}$, is provided between the two HFSCs. Power supply line 36 could also be a ground reference. Conductive ground planes are formed above and below HFSCs 16A-16B to further reduce cross talk between signal conductor lines as shown in reference to FIG. 1.

By now it should be appreciated that an integrated circuit package has been provided with a low reflection input configuration so that high speed signals can be propagated from a signal line external to the package to an integrated circuit within the package with a minimum impedance mismatch between the package and the external signal line. This package results in a minimum amount of distortion of a high speed input signal to the integrated circuit, and allows higher clock speeds, up to 1 GHz or more, to be propagated to the integrated circuit. The low reflection input configuration allows multiple packages to be coupled in series to a single high frequency signal conductor so that a single clock signal may be shared among multiple semiconductor devices.

We claim:

1. A semiconductor package for electrically coupling to an integrated circuit having a low reflection input configuration comprising: a first external lead; a second external lead; a conductive path coupling the first and second external leads, wherein the conductive path has a substantially constant characteristic impedance and a portion of the conductive path forms a bonding pad; and a conductor coupled between the bonding pad and the integrated circuit disposed in the semiconductor package.

2. The semiconductor package of claim 1 wherein the characteristic impedance is approximately 50 ohms.

3. The semiconductor package of claim 1 wherein the conductor is a wirebond.

4. A semiconductor package for electrically coupling to an integrated circuit having a low reflection input configuration comprising: a first external lead; a second external lead; a first conductive path coupling the first and second external leads, wherein the first conductive path has a substantially constant characteristic impedance and a portion of the first conductive path forms a bonding pad; at least one second conductive path adjacent to the first conductive path in a same plane as the first conductive path, wherein a predetermined DC voltage is applied to the at least one second conductive path; and a conductor coupled between the bonding pad and the integrated circuit disposed in the semiconductor package.

5. The semiconductor package of claim 4 wherein the predetermined DC voltage is ground potential.

6. A low reflection input configuration package for integrated circuits comprising: a first pin; a second pin for receiving an input signal from a line having a constant characteristic impedance $Z_0$; and a signal conductor having constant characteristic impedance $Z_0$ interconnecting the first pin and the second pin and having a bonding pad for making electrical connection to the integrated circuit located within said low reflection input configuration package.

7. A semiconductor package for electrically coupling to an integrated circuit having a low reflection input configuration comprising: a first external lead; a second external lead; a conductive path coupling the first and second external leads, wherein the conductive path has a substantially constant characteristic impedance and a portion of the conductive path forms a bonding pad; conductive regions disposed above and below the conductive path and separated from the conductive path by respective layers of dielectric to form a stripline; and a conductor coupled between the bonding pad and the integrated circuit disposed in the semiconductor package.

8. A semiconductor package for electrically coupling to an integrated circuit having a low reflection input configuration comprising: a first external lead; a second external lead; a conductive path coupling the first and second external leads, wherein the conductive path has a substantially constant characteristic impedance and a portion of the conductive path forms a bonding pad; a terminating resistor coupled between the second external lead and ground; and a conductor coupled between the bonding pad and the integrated circuit disposed in the semiconductor package.

9. A semiconductor package for electrically coupling to an integrated circuit having a low reflection input configuration comprising: a first external lead; a second external lead; a conductive path coupling the first and second external leads, wherein the conductive path has a substantially constant characteristic impedance and a portion of the conductive path forms a bonding pad; and a conductor coupled between the bonding pad and the integrated circuit disposed in the semiconductor package, wherein the second external lead is coupled to another integrated circuit.

10. A semiconductor package for electrically coupling to an integrated circuit having a low reflection input configuration comprising: a first external lead, wherein the first external lead is located near an outside edge of the semiconductor package; a second external lead; a conductive path coupling the first and second external leads, wherein the conductive path has a substantially constant characteristic impedance and a portion of the conductive path forms a bonding pad and the conductive path also extends between the first external lead and the outside edge of the package; and a conductor coupled between the bonding pad and the integrated circuit disposed in the semiconductor package.

11. The semiconductor package of claim 10 wherein the conductive path is plated on a dielectric layer.

12. A semiconductor package for electrically coupling to an integrated circuit having two low reflection inputs, each low reflection input comprising: a first external lead; a second external lead; a conductive path coupling the first and second external leads, wherein the conductive path has a substantially constant characteristic impedance and a portion of the conductive path forms a bonding pad; and a conductor coupled between the bonding pad and the integrated circuit disposed in the semiconductor package, wherein the two low reflection inputs form a differential clock input.

13. A low reflection input configuration for integrated circuit packages comprising: a first interface pin and a second interface pin; and a stripline conductor interconnecting the first and second interface pins and having a predetermined characteristic impedance of approximately 50 ohms, wherein the interconnecting stripline conductor also forms a contact pad for interfacing to an integrated circuit disposed in said integrated circuit packages.

14. A low reflection input configuration for integrated circuit packages comprising: a first interface pin and a second interface pin; and a stripline conductor interconnecting the first and second interface pins and having a predetemined characteristic impedance, wherein the interconnecting stripline conductor also forms a contact pad for interfacing to an integrated circuit disposed in said integrated circuit packages.

15. The low reflection input of claim 14 further comprising conductive ground planes formed above and below the stripline conductor, and ground conductors formed asjacent to the stripline conductor in a same place as the conductor.

16. A low reflection input configuration for integrated circuit packages comprising: a first interface pin and a second interface pin; and a stripline conductor interconnecting the first and second interface pins and having a predetermined characteristic impedance, wherein the interconnecting stripline conductor also forms a contact pad for interfacing to an integrated circuit disposed in said integrated circuit packages, wherein a characteristic impedance of the contact pad is approximately 20% higher than the predetermined characteristic impedance.

* * * * *